United States Patent
Moon et al.

(10) Patent No.: US 7,750,883 B2
(45) Date of Patent: Jul. 6, 2010

(54) LIQUID CRYSTAL DISPLAY DEVICE AND METHOD FOR DRIVING THE SAME

(75) Inventors: Su Hwan Moon, Gumi-si (KR); Do Heon Kim, Busan-si (KR); Ji Eun Chae, Gumi-si (JP)

(73) Assignee: LG Display Co., Ltd., Seoul (KR)

( * ) Notice: Subject to any disclaimer, the term of this patent is extended or adjusted under 35 U.S.C. 154(b) by 364 days.

(21) Appl. No.: 11/646,248

(22) Filed: Dec. 28, 2006

(65) Prior Publication Data
US 2007/0296676 A1 Dec. 27, 2007

(30) Foreign Application Priority Data
Jun. 21, 2006 (KR) .............. 10-2006-0055800

(51) Int. Cl.
*G09G 3/36* (2006.01)
(52) U.S. Cl. .............. 345/98; 257/59; 257/72; 257/E27.152
(58) Field of Classification Search ........... 257/59, 257/72, E27.152; 345/100, 103, 98, 99; 349/139, 349/145, 90, 92, 151, 152, 42, 43
See application file for complete search history.

(56) References Cited

U.S. PATENT DOCUMENTS

| | | | | |
|---|---|---|---|---|
| 7,397,456 | B2 * | 7/2008 | Igarashi | 345/88 |
| 2004/0051484 | A1 * | 3/2004 | Moon | 315/312 |
| 2006/0109235 | A1 * | 5/2006 | Hung et al. | 345/103 |
| 2006/0164356 | A1 * | 7/2006 | Yang et al. | 345/89 |
| 2007/0057899 | A1 | 3/2007 | Yamashita | |

FOREIGN PATENT DOCUMENTS

JP 2002-351414 6/2002

* cited by examiner

*Primary Examiner*—Sue A Purvis
*Assistant Examiner*—Selim Ahmed
(74) *Attorney, Agent, or Firm*—Birch, Stewart, Kolasch, & Birch LLP

(57) ABSTRACT

A liquid crystal display device including a liquid crystal panel, a gate driver configured to supply gate signals to gate lines on the liquid crystal panel, a data driver configured to supply data voltages to data lines on the liquid crystal panel, and a partial controller configured to control the gate driver to intercept a part of the gate signals to be supplied to the gate lines.

13 Claims, 6 Drawing Sheets

US 7,750,883 B2

LIQUID CRYSTAL DISPLAY DEVICE AND METHOD FOR DRIVING THE SAME

CROSS-REFERENCE TO A RELATED APPLICATION

This application claims the benefit of Korean Patent Application No. 10-2006-0055800, filed on Jun. 21, 2006, in the Korean Intellectual Property Office, the disclosure of which is incorporated herein by reference.

BACKGROUND

1. Field of the Invention

The present invention relates to a liquid crystal display device, and more particularly to a liquid crystal display device and corresponding driving method for displaying an image on only a part of a panel.

2. Discussion of Related Art

Various flat panel display devices such as a Liquid Crystal Display device (LCD), a Plasma Display Panel (PDP), and an Electro Luminescent Display Device (ELD) are currently being used in as display devices in different types of device. The LCD device is most widely used as a portable image display device due to its excellent image quality, its light weight, its slimness, and its low power consumption. Further, the LCD device is being used as a television monitor, a notebook computer, etc.

Recently, so as to reduce the cost of manufacturing the LCD device, a gate-on-glass (GOG) type LCD has been proposed. The GOG type LCD includes a liquid crystal panel on which a gate driver is mounted. Further, in the GOG type LCD, the gate driver is manufactured simultaneously with the liquid crystal panel. In addition, the GOG type LCD may include a liquid crystal panel on which a data driver is mounted. The GOG type LCD will be now described with reference to FIG. 1.

As shown in FIG. 1, a related art GOG type LCD includes a liquid crystal panel 2 on which an image is displayed. The liquid crystal panel 2 includes a display region 22 and a gate driver 4. The gate driver 4 is disposed at an edge (left edge) of one side of the display region 22 and is adjacent to the display region 22.

In addition, the display region 22 of the liquid crystal panel 2 includes thin film transistors TFT, which are respectively formed at pixel regions divided by a plurality gate and data lines (not shown). Also, each thin film transistor is electrically connected to a corresponding data line and gate line. Further, the gate driver 4 is electrically connected to respective gate lines on the display region 22.

The GOG type LCD of FIG. 1 also includes a printed circuit board 12 connected to the liquid crystal panel 2 through tape carrier packages (TCPs) 7A-7C. In addition, corresponding data driver integrated circuit (IC) chips 6A-6C are mounted on the TCPs 7A-7C. The data driver IC chips 6A-6C division-drive a plurality of data lines on the liquid crystal panel 2.

To do this, the data driver IC chips 6A-6C are electrically connected to parts of a plurality of data lines on the liquid crystal panel 2 by corresponding TCPs 7A-7C, respectively. As shown, a timing controller 8 is mounted on the printed circuit board 12 and controls the gate driver 4 and the data driver IC chips 6A-6C. To do this, the timing controller 8 is electrically to the data driver IC chips 6A-6C and the gate driver 4 via one of the TCPs 7A-7C.

Next, as shown in FIG. 2, the gate driver 4 includes a plurality of shift register stages S/R1-S/Rn, which are dependently coupled to each other. The same number of gate lines is present at the liquid crystal panel 2 corresponding to the number of shift register stages S/R1-S/Rn. Further, an output signal generated from each of the shift register stages S/R1-S/Rn is supplied to an input terminal of a next shift register stage to drive it. Also, an output signal generated from each of the shift register stages S/R1-S/Rn is supplied to a corresponding gate line.

As shown in FIG. 3, the output signals of the shift register stages S/R1-S/Rn exclusively include enable signals, which are sequentially delayed. Further, a gate start pulse GSP is input to an input terminal of the first shift register state S/R1 among the shift register stages S/R1-S/Rn, which are dependently connected to each other. In addition, a shifting operation of the shift register stages S/R1-S/Rn is performed according to the gate start pulse GSP. The gate start pulse GSP is synchronous with a vertical synchronous signal and has a width corresponding to a time period of a horizontal synchronous signal.

Moreover, one of two clocks C1 and C2 is input to the shift register stages S/R1-S/Rn. In addition, the first clock C1 is input to odd-numbered shift register stages S/R1, S/R3, . . . , S/Rn−1, whereas the second clock C2 is input to even-numbered shift register stages S/R2, S/R4 . . . , S/Rn. Further, the two clocks C1 and C2 have an inverse phase to each other. Also, at least 3 clocks (for example, 3 or 4 clocks) are input to the shift register stages S/R1-S/Rn in common, or a part of 3 clocks can be selective supplied thereto. In this instance, the at least 3 clocks have a phase, which is sequentially delayed.

Further, the shift register stages S/R1-S/Rn latch a gate start pulse GSP supplied to an input terminal or an output signal of a previous shift register stage in response to the input clock C1 or C2. Through a latch operation of the shift register stages S/R1-S/Rn, as shown in FIG. 3, sequentially shifted gate signals GL1 through GLn are correspondingly supplied to a plurality of gate lines on the liquid crystal panel 2.

Also, the gate signals GL1-GLn from the shift register stages S/R1-S/Rn sequentially enable the plurality of gate lines on the liquid crystal panel 2 to sequentially turn on the thin film transistors line by line. Accordingly, data voltages on the plurality of data lines are sequentially supplied to pixels on the liquid crystal panel 2 line by line to display an image.

In addition, in the LCD device, the image is often displayed at a part of the display region 22 of the liquid crystal panel 2. For example, the image can be display at a center of the display region 22. In this instance, the GOG type LCD performs a complex control operation for the gate driver 4, the data driver IC chips 6A-6C, and the timing controller 8 to write a data voltage of a black level in the non-image section of the display region 22. Thus, the GOG type LCD unnecessarily increases the power consumption.

SUMMARY OF THE INVENTION

Accordingly, the present invention is directed to an LCD device that substantially obviates one or more of the problems due to limitations and disadvantages of the related art, and a method for driving the same.

Another an object of the present invention is to provide an LCD device and corresponding driving method that easily displays an image on a part of a screen.

Yet another object of the present invention is to provide an LCD device and corresponding driving method that easily displays an image on a part of a screen without unnecessary power consumption.

To achieve these and other advantages and in accordance with the purpose of the present invention, as embodied and broadly described herein, the present invention provides in one aspect a liquid crystal display device including a liquid crystal panel, a gate driver configured to supply gate signals to gate lines on the liquid crystal panel, a data driver configured to supply data voltages to data lines on the liquid crystal panel, and a partial controller configured to control the gate driver to intercept a part of the gate signals to be supplied to the gate lines.

In another aspect, the present invention provides a liquid crystal display device including a liquid crystal panel, a gate driver configured to supply gate signals to gate lines on the liquid crystal panel, a data driver configured to supply data voltages to data lines on the liquid crystal panel, a timing controller configured to control driving timings of the gate driver and the data driver, and to supply a pixel data stream to the data driver, and a partial controller configured to control the gate driver to intercept a part of the gate signals to be supplied to the gate lines.

In yet another aspect, the present invention provides a method for driving a liquid crystal display device including a gate driver for supplying gate signals to gate lines on a liquid crystal panel, and a data driver for supplying data voltages to data lines on the liquid crystal panel. The method includes controlling the gate driver to intercept a part of the gate signals to be supplied to the gate lines.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF PREFERRED EMBODIMENTS

Hereinafter, preferred embodiments according to the present invention will be described with reference to the accompanying drawings.

Figure 1:
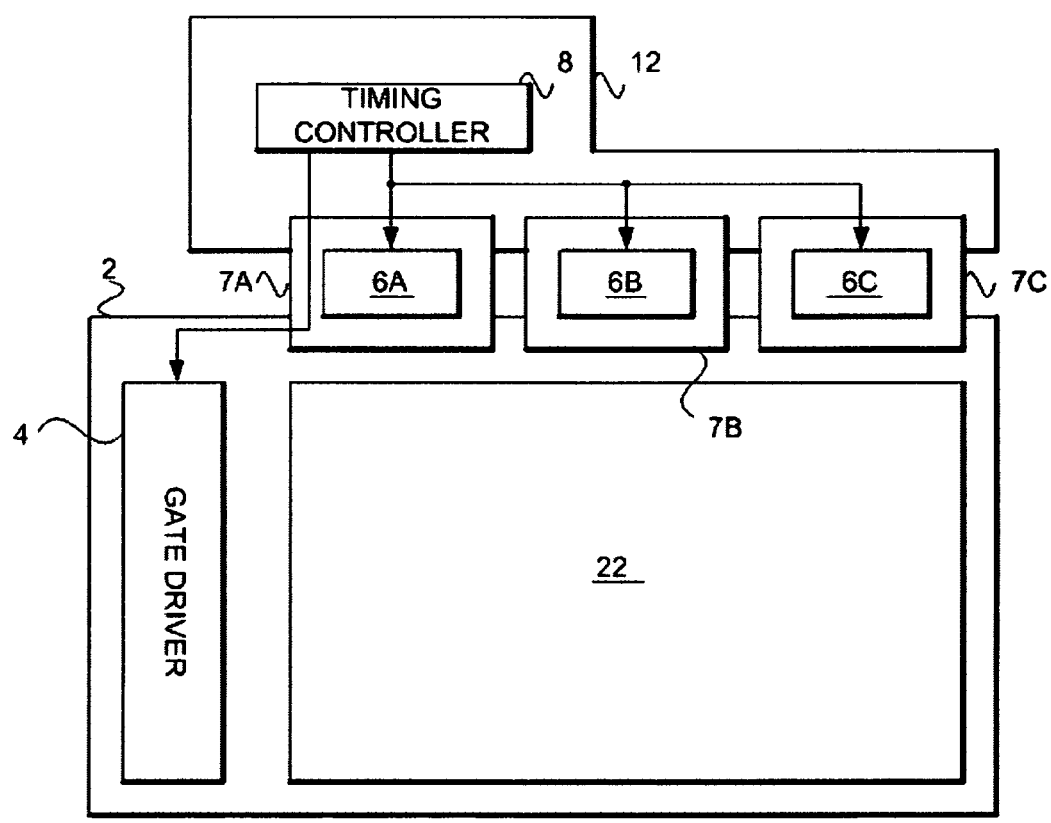
FIG. 1 is a block diagram illustrating a related LCD.
Figure 2:
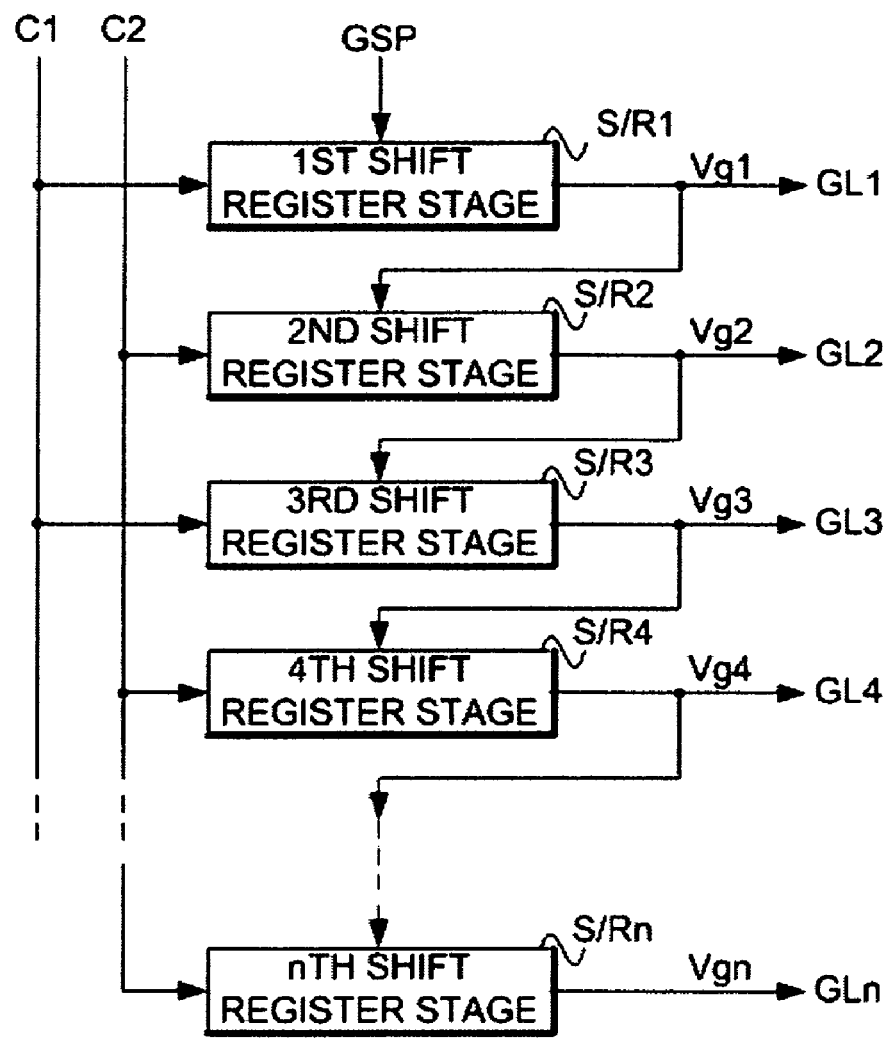
FIG. 2 is a block diagram illustrating a gate driver shown in FIG. 1.
Figure 3:
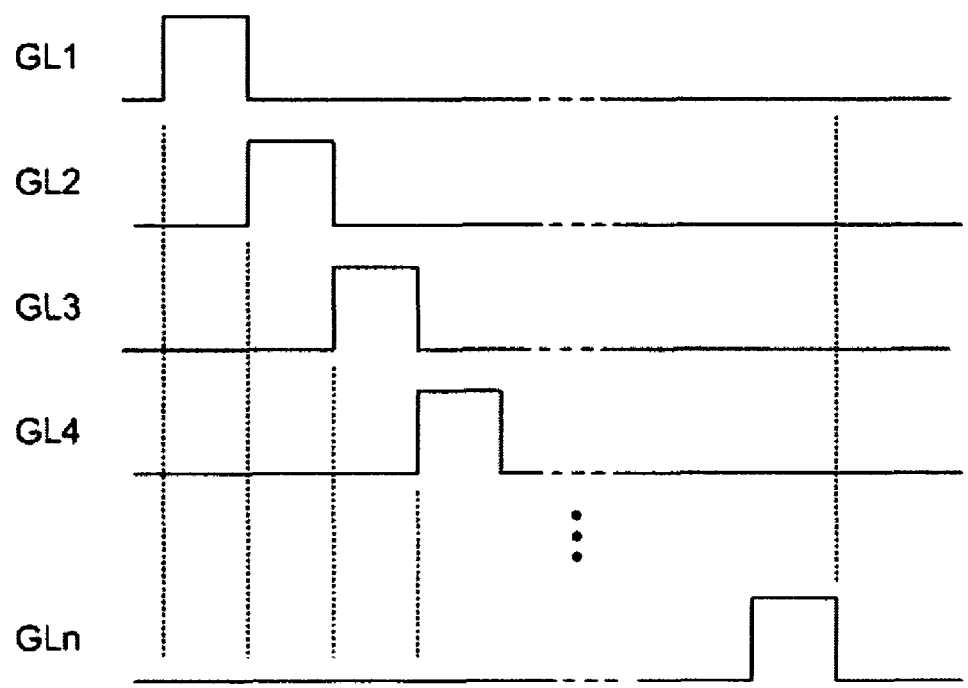
FIG. 3 is a timing diagram illustrating an output signal of the gate driver shown in FIG. 1.
Figure 4:
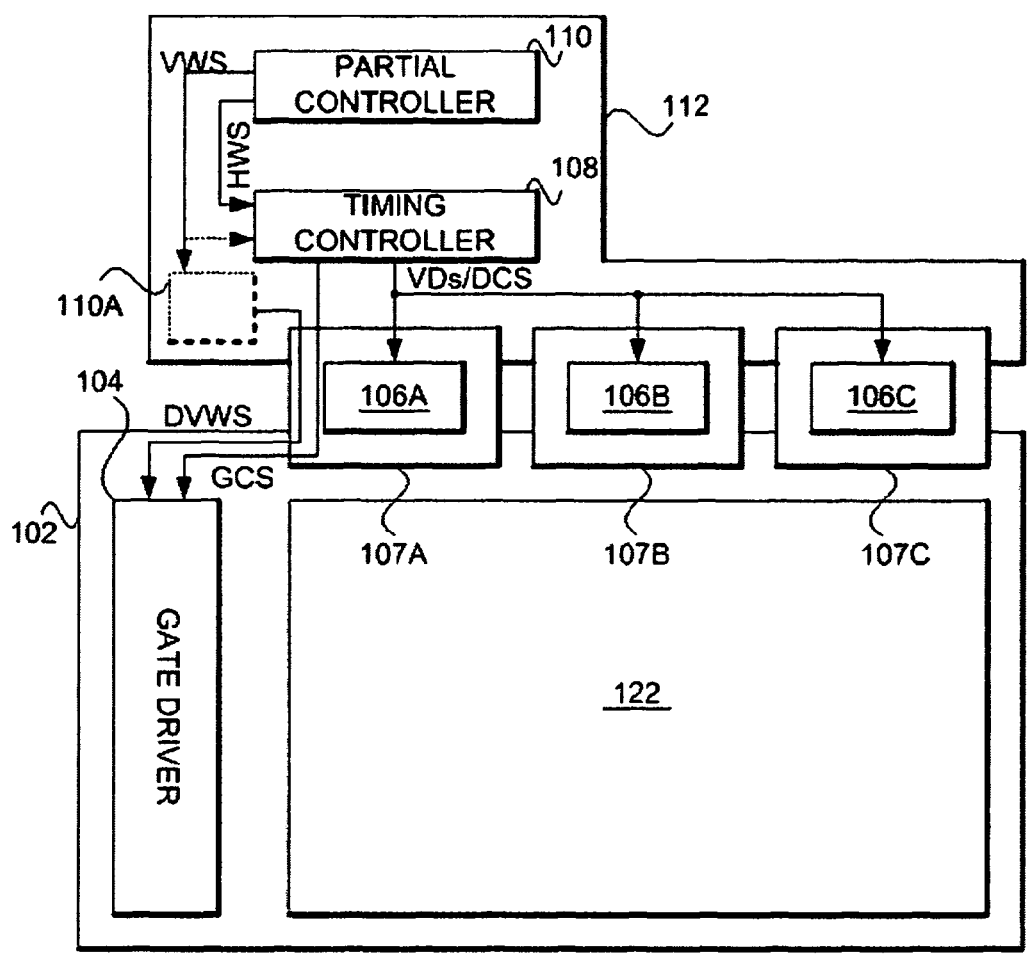
FIG. 4 is a block diagram illustrating an LCD according to an embodiment of the present invention.

Turning first to FIG. 4, which is a block diagram illustrating an LCD according to an embodiment of the present invention. As shown, the LCD includes a printed circuit board 112 connected to a liquid crystal panel 102 through TCPs 107A-107C. Further, the liquid crystal panel 102 includes a display region 122 and a gate driver 104. An image is displayed on the display region 122, and the gate driver 4 is disposed at an edge (namely, the left edge) of one side of the display region 122 and is adjacent to the display region 122. In addition, a plurality of gate and data lines (not shown) are formed to intersect each other in the display region 122.

Thin film transistors TFTs are also formed at pixel regions divided by the plurality of gate and data lines. In addition, the thin film transistors TFTs are electrically connected to corresponding gate lines and data lines, respectively. Also, a data voltage on the corresponding data line is selectively written to a corresponding pixel in response to a gate signal on a corresponding gate line. Further, the gate lines on the display region 122 extend to a left edge of the liquid crystal panel 102 to be electrically connected to the gate driver 104.

In addition, data driver IC chips 106A-106C are mounted on the TCPs 107A-107C, respectively, and division-drive the data lines on the liquid crystal panel 102. Further, the TCPs 107A-107C electrically connect the mounted data driver IC chips 106A-106C to the printed circuit board 112 and the data lines on the liquid crystal panel 102, and electrically connect the printed circuit board 112 to the liquid crystal panel 102. To do this, the TCPs 107A-107C each include a flexible insulation film on which a wiring pattern is formed.

In addition, the printed circuit board 112 includes a timing controller 108, which controls the gate driver 104 and the data driver IC chips 106A-106C. The timing controller 108 is electrically connected to the gate driver 104 and the data driver IC chips 106A-106C through the TCPs 107A-107C, and supplies the gate control signals GCS to the gate driver 104.

The gate control signal GCS includes at least one clock CLK and a gate start pulse GSP. Also, the at least one clock CLK has the same time period as or at least twice of that of a horizontal synchronous signal. In addition, the gate start pulse GSP is generated once every time period of a vertical synchronous signal, and data control signals DCS and a pixel data stream VDs are supplied to the data driver IC chips 106A-106C. Further, the pixel data stream VDs are serially provided to the data driver IC chips 106A-106C to classify pixel data one line by one line.

The LCD in FIG. 4 also includes a partial controller 110 mounted on the printed circuit board 112 to control an image to be displayed on only a part of the display region 122 of the liquid crystal panel 102. In more detail, the partial controller 110 provides a vertical window control signal VWS to the gate driver 104 positioned at an edge of the liquid crystal panel 102 through one (namely, the first TCP 107A) among the TCPs 107A-107C.

Here, the vertical window control signal VWS controls an output time period of the gate driver 104. In addition, the vertical window control signal VWS has a vertical window pulse of a low logic for designating an output limit period of a gate signal during a time period of a vertical synchronous signal (a time period when a piece of an image is displayed).

In response to the vertical window control signals VWS, the gate driver 104 makes gate signals enabled during a time period of a vertical window pulse among gate signals to be supplied to the plurality of gate lines not to be provided to corresponding gate lines. On the contrary, gate signals generated by the gate driver 104 during an enable time period of a specific logic (for example, high logic) among the vertical window control signals VWS are provided to corresponding gate lines.

Thus, only a part of the plurality of gate lines on the display region 122 is driven once every vertical synchronous time period, and a remainder thereof is not driven. Accordingly, an image is displayed on only the part of the display region 122.

Further, a width and a position of a vertical window pulse included in the vertical window control signals VWS can be changed based on a user's selection or a logic value of a window data set by an image program. Also, the window data is provided to the partial controller 110 from the timing controller 108 or an external system (not shown), for example, a graphic card of a computer system or an image demodulation module of a television receiver.

In other words, the partial controller 110 generates a vertical window control signal VWS, which has a vertical window pulse with a width and a phase corresponding to a logic value of a window data from the timing controller 108 or the external system, and provides the vertical window control signal VWS to the gate driver 104 on the liquid crystal panel 102 through the first TCP 107A. Accordingly, the gate driver 104 supplies the gate signals to parts of the gate lines but not to the other parts.

Consequently, a vertical width of the display region 122 is reduced. Thus, the image is displayed on a center part, an upper part, and a lower part of the display region 122. In addition, because parts of the gate lines on the liquid crystal panel corresponding to a time period of the vertical window pulse are not driven, an unnecessary power is not consumed during a local display. Further, during a vertical period of the display region 122 corresponding to the vertical window pulse, a degraded image or noise components can be displayed.

In addition, in another embodiment, the vertical window control signal VWS generated by the partial controller 110 may also be provided to the timing controller 108. In this instance, a frame delay section 110A is further provided between the partial controller 110 and the gate driver 104. In more detail, the frame delay section 110A delays the vertical window control signal VWS to be supplied to the gate driver 104 from the partial controller 110 by a time period of one frame (namely, one vertical synchronous signal).

Thus, because of the frame delay section 110A, the vertical window period of the display region on the liquid crystal panel is initialized during a first frame (namely, the time period of a first vertical synchronous signal), in which a local display starts. During an initialization period of the vertical window period (that is, the time period of a vertical synchronous signal in which a first vertical window pulse is generated), the timing controller 108 supplies pixel data of a black level and video information to the data driver IC chips 106A-106C.

Further, the pixel data of black level is supplied to the data driver IC chips 106A-106C from the timing controller 108 during time periods of horizontal synchronous signals included in a time period of a vertical window pulse of the vertical window control signal VWS. In addition, the pixel data of video information supplied to the data driver IC chips 106A-106C from the timing controller 108 during time periods of remaining horizontal synchronous signals included in an enable time period (namely, the specific logic period) of the vertical window control signal VWS.

Accordingly, black is displayed during a partial vertical period corresponding to a width of a vertical window pulse of the display region 122 on the liquid crystal panel 102, whereas a video image is displayed during a remaining period corresponding to an enable period of the vertical window control signal VWS. Further, during a time period (namely, the local display period) of frames (namely, the vertical synchronous signals), in which a vertical window pulse is included in the vertical window control signal DVWS delayed after an initialization of the vertical window period, the timing controller 108 supplies the pixel data corresponding to the video information to the data driver IC chips 106A-106C only an enable time period of the vertical window control signal VWS.

Also, the timing controller 108 does not drive the data driver IC chips 106A-106C not to supply the pixel data to the data driver IC chips 106A-106C during a time period of a vertical window pulse. In other words, the timing controller 108 does not update the pixel data of the black level of a vertical period corresponding to a time period of a vertical window pulse of the display region 122, but updates only the pixel data of the video information of a remaining period corresponding to an enable period of the vertical window control signal VWS of the display region 122.

Accordingly, a black image is displayed during a vertical period corresponding to a time period of a vertical window pulse of the display region 122. Further, video information is displayed during a remaining period corresponding to an enable period of the vertical window control signal VWS of the display region 122. On the other hand, the gate driver 104 provides only gate signals generated during an enable period of a specific logic among a displayed vertical window control signal VWS to corresponding gate lines.

In other words, the gate driver 104 makes the gate signals enabled during a time period of a vertical window pulse among the gate signals to be supplied to a plurality of gate lines not to be supplied to corresponding gate lines. Accordingly, partial gate lines among a plurality of gate lines on the display region 122 corresponding to a vertical window period are not driven, whereas only the remaining gate lines corresponding to an enable period of a delayed vertical window control signal DVWS are driven once every vertical synchronous period.

Because the data driver IC chips 106A-106C are periodically not driven and partial gate lines are not driven, the power consumption is gradually reduced during a local display period. Further, the partial controller 110 may generate and provide a horizontal window control signal HWS to the timing controller 108. That is, the horizontal window control signal HWS supplied to the timing controller 108 has a horizontal window pulse of a low logic to designate an output limit period of a pixel data during a time period of a horizontal synchronous signal (a time period in which a pixel of one line is written to a display region 122 of the liquid crystal panel 102).

In response to the horizontal window control signal HWS, the timing controller 108 supplies a pixel data of one line including a pixel data of black level and a pixel data of video information every horizontal synchronous signal period. Further, the pixel data of the black level is supplied to the data driver IC chips 106A-106C from the timing controller 108 during a time period (namely, the low logic period) of a horizontal window pulse of the horizontal window control signal HWS.

In addition, the pixel data of video information is supplied to the data driver IC chips 106A-106C from the timing controller 108 during an enable time period (namely, the specific logic period) of the horizontal window control signal HWS. A pixel data stream of one line including the pixel data of the black level and the pixel data of the video information can be output during only an enable period of the vertical window control signal VWS.

Further, a black image is displayed during a partial horizontal period corresponding to a width of a horizontal window pulse of the display region 122, whereas a video image is displayed during a remaining horizontal period corresponding to an enable period of the horizontal window control signal HWS. Accordingly, the image can be locally displayed at only one of an upper left part, an upper center part, an upper right part, a lower left part, a lower center part, a lower right part, a left part, a center part, and a right part of a center between upper and lower ends in the display region 122.

Figure 5:
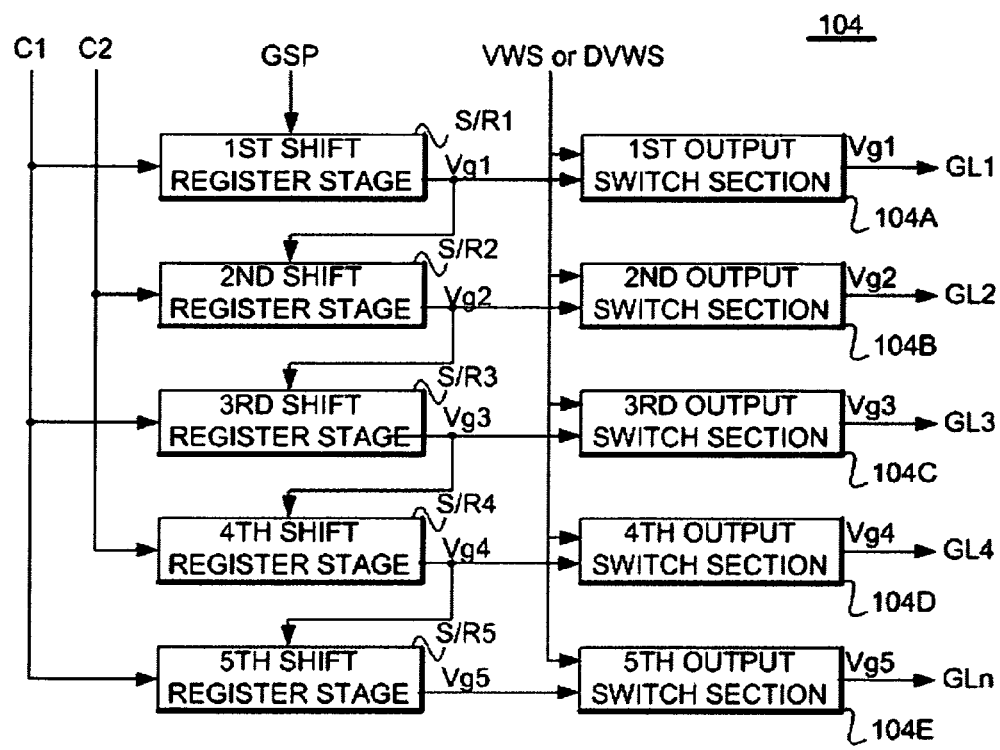
FIG. 5 is a block diagram illustrating a gate driver shown in FIG. 4.

Next, FIG. 5 is a block diagram illustrating in detail the gate driver 104 shown in FIG. 4. As shown, the gate driver 104 includes a plurality of shift register stages S/R1-S/R5 and a plurality of output switch sections 104A-104E. The plurality of shift register stages S/R1-S/R5 are independently coupled to an input line of a gate start pulse GSP.

Further, the plurality of output switch sections 104A-104E are coupled to the shift register stages S/R1-S/R5. One of first and second clocks CLK1 and CLK2 is input to the shift register stages S/R1 through S/R5, and the first and second clocks CLK1 and CLK2 are alternately input to the shift register stages S/R1-S/R5. In other words, the first clock CLK1 is input to odd-numbered shift register stages S/R1, S/R3, and S/R5, whereas the second clock CLK2 is input to even-numbered shift register stages S/R2 and S/R4.

In addition, the first and second clocks CLK1 and CLK2 have inverse phases to each other and a frequency (time period of twice) of a half of a horizontal synchronous signal. Also, the shift register stages S/R1-S/R5 latch a gate start pulse GSP or a gate signal (one of Vg1 through Vg5) from a previous shift register state (one of S/R1-S/R4) in response to the first or second clock CLK1 and CLK2, and generate gate signals Vg1-Vg5 to be supplied to corresponding gate lines GL1-GL5.

A first shift register stage S/R1 latches a gate start pulse GSP in response to the first clock CLK1, and generates a first gate signal Vg1. Further, the first gate signal Vg1 is provided to a first output switch section 104A and a second shift register state S/R2. A second shift register stage S/R2 latches the first gate signal Vg1 from the first shift register S/R1 being a previous stage in response to the second clock CLK2, and generates a second gate signal Vg2.

In addition, the second gate signal Vg2 is provided to a second output switch section 104B and a third shift register state S/R3 being a next stage. Also, a third shift register stage S/R3 latches the second gate signal Vg2 from the second shift register S/R2 being a previous stage in response to the first clock CLK1, and generates a third gate signal Vg3. The third gate signal Vg3 is provided to a third output switch section 104C and a fourth shift register state S/R4 being a next stage.

In the same manner, the fourth and fifth shift register stages S/R4 and S/R5 latch the third and fourth gate signals Vg3 and Vg4 from the third and fourth shift registers S/R3 and S/R4 being previous stages in response to the first and second clocks CLK1 and CLK2, respectively, and generate fourth and fifth gate signals Vg4 and Vg5. In addition, the gate signals Vg1-Vg5 generated by the shift register stages S/R1-S/R5 are sequentially enabled in a specific logic (for example, the high logic) by a time period of one horizontal synchronous signal.

Further, the plurality of output switch sections 104A-104E are electrically connected to the plurality of gate lines GL1-GL5 on the display region 122 of the liquid crystal panel 102. In addition, the plurality of output switch sections 104A-104E receive the vertical window control signal VWS from the partial controller 110 shown in FIG. 4 or the delayed vertical window control signal DVWS from the delay section 110A in common.

In response to the vertical window control signal VWS or the delayed vertical window control signal DVWS, the plurality of output switch sections 104A-104E switch gate signals Vg1-Vg5 to be supplied to the gate lines GL1-GL5 form the shift register stages S/R1-S/R5. In addition, during a time period (of the low logic) of a vertical window pulse of the vertical window control signal VWS or the delayed vertical window control signal DVWS, the output switch sections 104A-104E intercept corresponding gate signals Vg1-Vg5 to be supplied to corresponding gate lines GL1-GL5 from the shift register stages S/R1 through S/R5.

In addition, during an enable time period of a specific logic of the vertical window control signal VWS or the delayed vertical window control signal DVWS, the output switch sections 104A-104E provide corresponding gate signals Vg1-Vg5 from the shift register stages S/R1-S/R5 to corresponding gate lines GL1-GL5.

For example, when a vertical window pulse of a low logic included in the vertical window control signal VWS or the delayed vertical window control signal DVWS has time periods of two initial horizontal synchronous signals among time periods of the vertical synchronous signal, the first and second output switch sections 104A and 104B intercept the first and second gate signals Vg1 and Vg2 to be supplied to the first and second gate lines GL1 and GL2 from the first and second shift register stages S/R1 and S/R2, but provide the third through fifth gate signals Vg3-Vg5 generated in the third through fifth shift register stages S/R3-S/R5 to third through fifth gate lines GL3-GL5.

In addition, pixels on the first and second gate lines GL1 and GL2 are not driven, whereas pixels on third through fifth gate lines GL3-GL5 are normally driven. As a result, an image is displayed on only a lower half part of the display region 122 on the liquid crystal panel 102.

Also, when the vertical window pulse of the low logic included in the vertical window control signal VWS or the delayed vertical window control signal DVWS has time periods of two last horizontal synchronous signals among time periods of the vertical synchronous signal, the fourth and fifth output switch sections 104D and 104E intercept the fourth and fifth gate signals Vg4 and Vg5 to be supplied to the fourth and fifth gate lines GL4 and GL5 from the fourth and fifth shift register stages S/R4 and S/R5, but provide the first through third gate signals Vg1-Vg3 generated in the first through third shift register stages S/R1-S/R3 to first through third gate lines GL1-GL3.

In addition, pixels on the fourth and fifth gate lines GL4 and GL5 are not driven, whereas pixels on first through third gate lines GL1-GL3 are normally driven. As a result, an image is displayed on only an upper half part of the display region 122 on the liquid crystal panel 102.

Thus, because the position and width of a vertical window pulse of the vertical window control signal VWS or the delayed vertical window control signal DVWS have a part of a time period of the vertical synchronous signal, an image is displayed on one of an upper part, a lower part, and a center part of the display region 122 on the liquid crystal panel 102. Further, the plurality of output switch sections 104*a*-104*e* for switching the corresponding gate signals Vg1-Vg5 may include a control switch, which may be controlled by the vertical window control signal VWS or the delayed vertical window control signal DVWS.

In a different way, the plurality of output switch sections 104A-104E may include a buffer, which is selectively driven by the vertical window control signal VWS or the delayed vertical window control signal DVWS. In this instance, the control switch or the buffer is coupled between a corresponding shift register state and a corresponding gate line.

In addition, the present invention has been described with reference to FIG. 5 in that the gate driver 104 includes first through fifth shift register stages S/R1-S/R5 and first through fifth output switch sections 104A-104E. However, only a part of the gate driver is shown in FIG. 5 for convenience of the description. That is, the number of the shift register stages and the output switch sections can be increased. Further, although a 2-phase clock having the first and second clocks CLK1 and CLK2 are used in the gate driver 104 of FIG. 5, it is possible to use more than 2 clocks (for example, a 3-phase clock or 4-phase clock).

Figure 6:
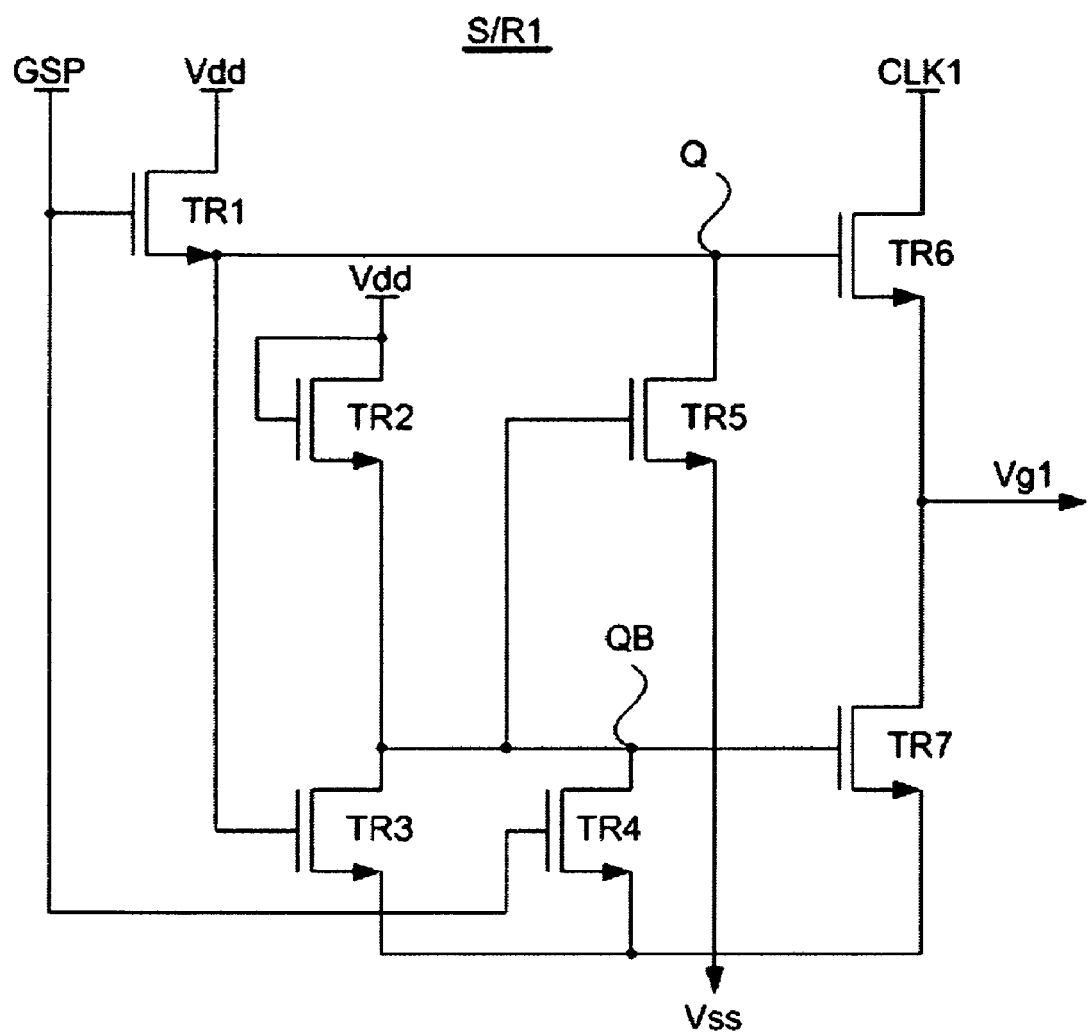
FIG. 6 is a block diagram illustrating a first shift register shown in FIG. 5 in detail.

Turning next to FIG. 6, which is a block diagram illustrating in detail the first shift register S/R1 shown in FIG. 5. As shown in FIG. 6, the first shift register stage S/R1 includes first through seventh transistors TR1-TR7. In more detail, the first transistor TR1 includes a gate terminal connected to an input line of a gate start pulse GSP, a source terminal connected to an input line of a first supply voltage Vdd, and a drain terminal connected to a gate terminal of the third transistor TR3.

Further, for shift register stages other than the first shift register stage S/R1, a gate terminal of the first transistor TRI is connected to an output line of a previous shift register stage. Also, a gate terminal and a source terminal of a second transistor TR2 are connected to an input line of a first supply voltage Vdd, and a drain terminal of the second transistor TR2 and a source terminal of the third transistor TR3 are connected to an inversion node QB.

As described above, the gate terminal of the third transistor TR3 is connected to the drain terminal of the first transistor TRI. Further, the third transistor TR3 includes a source terminal connected to the inversion node QB and a drain terminal coupled to drain terminals of the fourth, fifth, and seventh transistors TR4, TR5, and TR7, and an input line of a second supply voltage Vss.

In other words, the drain terminal of the second transistor TR2 and the source terminal are coupled to the inversion node QB in common. In addition, the fourth transistor TR4 includes a gate terminal connected to the input line of the start pulse GSP and a source terminal connected to the inversion node QB. Also, for the remaining shift register stages S/R2-S/R5 except for the first shift register stage S/R1, the gate terminal of the fourth transistor TR4 is coupled with input lines of the gate signals Vg1-Vg4 from previous shift register stages S/R1-S/R4.

In addition, the fifth transistor TR5 includes a gate terminal connected to the inversion node QB and a source terminal connected to a non-inversion node Q. The source terminal of the sixth transistor TR6 is coupled with an input line of the first clock CLK1. Also, for odd-numbered shift register stages S/R3 and S/R5 as well as the first shift register stage S/R1, the source terminal of the sixth transistor TR6 is coupled with the input line of the first clock CLK1.

In a different way, in the even-numbered shift register stages S/R2 and S/R4, the source terminal of the sixth transistor TR6 is coupled to an input line of the second clock CLK2. In addition, the drain terminal of the sixth transistor TR6 is connected to an input terminal of the first output switch section 104a and an input terminal of the previous shift register stage S/R2.

Also, the gate terminal of the seventh transistor TR7 is connected to an inversion node QB. Further, the source terminal of the seventh transistor TR7 is connected to the drain terminal of the sixth transistor TR6, an input terminal of the first output switch section 104a, and an input terminal of the previous shift register stage S/R2.

An operation of the first shift register stage S/R1 having the construction described above will be now described. The first and clocks CLK1 and CLK2 have inverse phases to each other. Also, a gate start pulse GSP corresponds to a low logic interval of the first clock CLK1 or partially overlaps with a start part of a high logic interval of the first clock CLK1.

Thus, when a gate start pulse GSP of a high level is generated, the first and fourth transistors TR1 and TR4 are turned on. Also, a first supply voltage Vdd of a high level is charged to the non-inversion node Q through the first transistor TRI turned-on to increase a voltage on the non-inversion node Q. When the voltage on the non-inversion node Q is equal to or greater than a threshold voltage, the sixth transistor TR6 electrically connects the input line of the first clock CLK1 to a previous shift register stage and an input line of a corresponding output switch section (namely, the first output switch section 104a).

On the other hand, in response to a gate start pulse of a high logic, the fourth transistor TR4 discharges a voltage charged on the inversion node QB to an input line direction of the second supply voltage Vss to reduce the voltage on the inversion node QB. In addition, when the voltage on the non-inversion node Q is equal to or greater than the threshold voltage, the third transistor TR3 is turned-on to discharge the voltage on the inversion node Q to an input line direction of the second supply voltage Vss.

Accordingly, the voltage on the inversion node QB is rapidly reduced by the third and fourth transistors TR3 and TR4. When the voltage on the inversion node QB is reduced to a value less than or equal to the threshold voltage, the fifth transistor TR5 is turned-off not to discharge the voltage on the non-inversion node Q.

In response to the voltage on the inversion node QB reduced to the value less than or equal to the threshold voltage, the seventh transistor TR7 is turned-off, so that an input line of the second supply voltage Vss is electrically isolated from input terminals of the previous shift register stage S/R2 and the corresponding output switch section 104a.

In addition, a state in which the non-inversion node Q maintains a voltage equal to or greater than the threshold voltage and the voltage of the inversion node QB is reduced to less than or equal to the threshold voltage, is maintained until the first clock CLK1 changes to a low logic state after it rises to a high logic state although the gate start pulse GSP changes to a low logic state. Thus, in this state, when the first clock CLK1 rises to the high logic state, a gate signal Vg1 of a high level is generated at the input terminals of the next shift register stage S/R2 and the corresponding output switch section 104a.

Further, due to the high level voltage at the input terminals of the next shift register stage S/R2 and the corresponding output switch section 104a, a voltage on the non-inversion node Q is increased to supply a high logic voltage of the first clock. CLK1 to the input terminals of the next shift register stage S/R2 and the corresponding output switch section 104a without attenuation. Consequently, a gate signal Vg of a high level having the same width (time period of a horizontal synchronous signal) as that of the high logic interval of the first clock CLK is provided to the next shift register stage S/R2 and the corresponding output switch section 104a.

In addition, when the gate start pulse GSP changes to a low state, the first and fourth transistors TR1 and TR4 are turned-off. Accordingly, the first supply Vdd supplied to the non-inversion node Q is intercepted by the first transistor TR1, but a discharge path is open from the inversion node QB to an input line of the second supply voltage Vss through the fourth transistor TR4. Thus, the voltage at the inversion node QB is increased by a first supply voltage Vdd supplied through the second transistor TR2.

When the voltage at the inversion node QB reaches the threshold voltage, the fifth and seventh transistors TR5 and TR7 are turned-on. Further, the voltage of the non-inversion node Q is charged to an input line direction of the second supply voltage Vss and is slowly reduced. A second supply voltage of low level is provided to the input terminals of the next shift register stage S/R2 and the corresponding output switch section 104a through the seventh transistor TR7.

When the voltage of the non-inversion node Q is reduced to a value less than or equal to the threshold voltage, the third and sixth transistors TR3 and TR6 are turned-off. Due to the sixth transistor TR6 being turned-off, an input line of the first clock CLK1 is electrically isolated from the input terminals of the next shift register stage S/R2 and the corresponding output switch section 104a. Further, a discharge path formed from the inversion node QB to an input line of the second supply Vss through the third transistor TR3 is opened not to discharge the voltage of the inversion node QB.

Accordingly, the voltage of the non-inversion node Q less than or equal to the threshold voltage and the voltage of the inversion node QB equal to or greater than the threshold voltage are maintained until the gate start pulse GSP of a high logic is supplied thereto.

In addition, the first shift register stage S/R1 performs the operation of generating the gate signal once every frame (every time period of a vertical synchronous signal). Moreover, after the operation of generating the gate signal by the first shift register S/R1, the remaining shift register stages S/R2-S/R5 sequentially perform an operation of generating the gate signal. Accordingly, the plurality of shift register stages S/R1-S/R5 output sequence-shifted gate signals once every frame (every a time period of a vertical synchronous signal).

By this arrangement, the LCD according to an embodiment of the present invention intercepts parts of gate signals by a vertical window pulse having a part of a time period of a vertical synchronous signal not to drive a part of a display region on a liquid crystal panel. Accordingly, an image can be displayed on only one of an upper part, a lower part, and a center part of the display region on the liquid crystal panel. Further, unnecessary power consumption can be prevented during a local display operation.

Also, in the LCD according to an embodiment of the present invention, an operation of a data driver may periodically stop according to a vertical window pulse. Accordingly, unnecessary power consumption can be further prevented during a local display. Furthermore, when the local display starts, an image can be initialized with black on a part section of a display region corresponding to a time period of a vertical window pulse. Accordingly, the noise in a non-drive interval among the display region on the liquid crystal panel can be removed.

Moreover, in the LCD according to an embodiment of the present invention, because a part of data voltages has a black level according to a horizontal window pulse having a part of a time period of a horizontal synchronous signal, an image may be displayed on only one of a left part, a right part, and a center part of a display region on the liquid crystal panel.

In addition, the LCD according to an embodiment of the present invention can drive a part of gate lines using vertical and horizontal window pulses, and display a part of the data voltages to be supplied to pixels on the gate lines driven with black. Accordingly, the image can be locally displayed on one of an upper left part, an upper center part, an upper right part, a lower left part, a lower center part, a lower right part, a left part, a center part, and a right part of a center between upper and lower ends in the display region on the liquid crystal panel.

Although preferred embodiments of the present invention have been shown and described, it would be appreciated by those skilled in the art that changes might be made in those embodiments without departing from the principles and spirit of the invention, the scope of which is defined in the claims and their equivalents.

What is claimed is:

1. A liquid crystal display device, comprising:
a liquid crystal panel;
a gate driver configured to supply gate signals to gate lines on the liquid crystal panel;
a data driver configured to supply data voltages to data lines on the liquid crystal panel;
a partial controller configured to control the gate driver to intercept a part of the gate signals to be supplied to the gate lines, wherein the partial controller generates a vertical window control signal which controls an output time period of the gate driver, to the gate driver; and
a delay section configured to delay the vertical window control signal supplied to the gate driver from the partial controller by a predetermined time period,
wherein the vertical window control signal has a vertical window pulse of a low logic for designating an output limit period of the gate signal during a time period of a vertical synchronous signal.

2. The liquid crystal display device according to claim 1, wherein the gate driver includes:
a plurality of shift register stages dependently connected to each other and configured to generate the gate signals; and
a plurality of output switch sections configured to selectively intercept the gate signals to be supplied to corresponding gate lines from the plurality of shift register stages in response to a control of the partial controller.

3. The liquid crystal display device according to claim 2, wherein the partial controller supplies the vertical window pulse to the plurality of output switch sections in common.

4. The liquid crystal display device according to claim 3, wherein the plurality of output switch sections intercept the gate signals during the time period of the vertical window pulse.

5. The liquid crystal display device according to claim 1, wherein the partial controller further controls the data driver to display a part of pixels on the liquid crystal panel corresponding to a remainder of the gate signals with a black color.

6. The liquid crystal display device according to claim 1, wherein the partial controller further controls the data driver to initialize pixels on the liquid crystal panel corresponding to the part of the gate signals with a black color.

7. The liquid crystal display device according to claim 6, wherein the partial controller further controls the data driver to display a part of pixels on the liquid crystal panel corresponding to a remainder of the gate signals with a black color.

8. A liquid crystal display device comprising:
a liquid crystal panel;
a gate driver configured to supply gate signals to gate lines on the liquid crystal panel;
a data driver configured to supply data voltages to data lines on the liquid crystal panel;
a timing controller configured to control driving timings of the gate driver and the data driver, and to supply a pixel data stream to the data driver;
a partial controller configured to control the gate driver to intercept a part of the gate signals to be supplied to the gate lines, wherein the partial controller generates a vertical window control signal which controls an output time period of the gate driver, to the gate driver; and a delay section configured to delay the vertical window control signal supplied to the gate driver from the partial controller by a predetermined time period, wherein the vertical window control signal has a vertical window pulse of a low logic for designating an output limit period of the gate signal during a time period of a vertical synchronous signal.

9. The liquid crystal display device according to claim 8, wherein the gate driver includes:

a plurality of shift register stages configured to dependently generate the gate signals in response to a gate start pulse from the timing controller; and a plurality of output switch sections configured to selectively intercept the gate signals to be supplied to corresponding gate lines from the plurality of shift register stages in response to a control of the partial controller.

10. The liquid crystal display device according to claim 9, wherein the partial controller supplies the vertical window pulse to the plurality of output switch sections in common.

11. The liquid crystal display device according to claim 10, wherein the plurality of output switch sections intercept the gate signals during the time period of the vertical window pulse.

12. The liquid crystal display device according to claim 8, wherein the partial controller further controls the timing controller to display a part of pixels on the liquid crystal panel corresponding to a remainder of the gate signals with a black color.

13. The liquid crystal display device according to claim 8, wherein the partial controller further controls the timing controller to initialize pixels on the liquid crystal panel corresponding to the part of the gate signals with a black color.

* * * * *